United States Patent [19]
Stoica

[11] Patent Number: 5,027,355
[45] Date of Patent: Jun. 25, 1991

[54] LOGIC CIRCUIT AND DESIGN METHOD FOR IMPROVED TESTABILITY

[75] Inventor: Susana Stoica, Edina, Minn.

[73] Assignee: Control Data Corporation, Minneapolis, Minn.

[21] Appl. No.: 338,804

[22] Filed: Apr. 14, 1989

[51] Int. Cl.$^5$ .................. G01R 31/28; G06F 15/60
[52] U.S. Cl. ................................ 371/22.1; 364/488
[58] Field of Search ............ 371/22.1, 22.3, 15.1; 364/488, 578, 579, 489; 324/73.1, 158 R

[56] References Cited

U.S. PATENT DOCUMENTS

| | | | |
|---|---|---|---|
| 4,509,008 | 4/1985 | Das Gupta et al. | 371/22.3 |
| 4,701,920 | 10/1987 | Resnick et al. | 371/22.5 |
| 4,703,484 | 10/1987 | Rolfe et al. | 371/22.3 |
| 4,791,578 | 12/1988 | Fazio et al. | 364/488 |
| 4,816,999 | 3/1989 | Berman et al. | 364/489 |

OTHER PUBLICATIONS

T. C. Hu et al., "Theory and Concepts of Circuit Layout", *IEEE Press*, pp. 3–18, 1985.
Sharad C. Seth et al., "Predict-Probabilistic Estimation of Digital Circuit Testability", *IEEE Press*, 1985, pp. 220–225.
Sunil K. Jain et al., "Stefan: An Alternative To Fault Simultation", *IEEE Press*, 1984, pp. 18–23.
Control Data Corp., Engineering Specification entitled "Design Guide for the VLSI-7118 CMOS Gate Array", 1986, pp. 1 and 128–133.

*Primary Examiner*—Charles E. Atkinson
*Attorney, Agent, or Firm*—Kinney & Lange

[57] ABSTRACT

A method for designing integrated circuits for improved testability. A main logic function operable in initialization and test modes is defined in terms of component logic macros. Testability circuitry for generating CLEAR, CLEAR0 and CLEAR1 testability signals is also defined. The CLEAR signals have the first logic state during system operation in the initialization mode, and first and second logic states equal amounts of time during the test mode. The CLEAR0 signals have the first logic state during the initialization mode, and have the second logic state most of the time and the first logic state the remainder of the time during the test mode. The CLEAR1 signals have the first logic state during the initialization mode, and have the first logic state most of the time and the second logic state the remainder of the time during the test mode. First-type macros, such as multiplexers having Select or other inputs requiring CLEAR signals during the test mode, are identified. Second-type macros such as flip flops having clear, set or other inputs requiring CLEAR0 signals during the test mode are identified. Third-type macros such as flip flops having Enable or other inputs requiring CLEAR1 signals during the test mode are identified. Interconnections between the identified first, second and third-type macros and associated CLEAR, CLEAR0 and CLEAR1 signals are defined. Both logic and timing simulations and testability analysis on the integrated circuit can then be performed before the main logic function is redefined.

20 Claims, 4 Drawing Sheets

LOGIC CIRCUIT AND DESIGN METHOD FOR IMPROVED TESTABILITY

BACKGROUND OF THE INVENTION

1. Field of the Invention

The present invention relates generally to the design of electronic systems. In particular, the present invention is a method and circuit for shortening the design cycle of integrated circuits.

2. Description of the Prior art

The design of VLSI and other integrated circuits is typically done using computer-aided design (CAD) work stations. Information stored in the work station includes cell libraries (data representative of the interconnections between transistors to form basic circuit logic elements or macros including AND, OR and other logic gates, adders, counters, flip flops, memory, registers, etc.), placement programs for efficiently arranging the macros on an integrated circuit substrate, router programs for laying out the interconnections between the macros, simulation programs and other software design tools. Knowing the required specifications of the integrated circuit, the designer has traditionally followed design procedures of the type illustrated in FIG. 1.

The main logic function of the integrated circuit is first schematically defined in terms of the component macros from which it is to be formed and a series of net lists which characterize terminals of the macros which are to be interconnected. Once the integrated circuit has been initially laid out in this manner, the design must be thoroughly tested to ensure its proper operation. Integrated circuit testing is typically performed in two sequential phases. The first phase involves functional testing or logic and timing simulations. The second phase involves testability analysis.

Logic and timing simulations are performed to determine whether the integrated circuit is functioning properly, i.e. whether the logic is operating in the intended manner. These simulations typically require one to five days of the designer's time. Errors in the design will undoubtedly be identified during logic and timing simulation. Logic changes necessitated by these errors often take about one day of the designer's time. Modification (redefinition) of the integrated circuit's schematic as a result of the logic changes takes another one to two days of the designer's time. Three to eight days are therefore required for each iteration of the logic and timing simulation phase. Furthermore, with larger VLSI integrated circuits it is often necessary to repeat these operations eight to fifteen times before all of the logic and timing problems have been worked out. It is not uncommon for a designer to devote two to three months to an integrated circuit design before it is functionally complete.

VLSI circuit chips must also be capable of being thoroughly tested following their manufacture. The design is therefore subjected to a testability analysis to ensure that it has this capability. A number of circuit test techniques such as built-in self-test and scan design are known and implemented in the design to facilitate this objective. Testing an integrated circuit involves viewing the circuit as an array of flip flops separated from one another by combinational logic. A set of test operands is clocked through the chip and their resultant outputs analyzed to determine whether or not the macros are functioning properly. In the case of integrated circuits with built-in self-test circuitry the test operands are random when initially applied to the main logic function, but become increasingly less random due to the combinational logic. The result is that circuits deep within the integrated circuit may not be adequately exercised. In order to find out the level of testability coverage for the circuit, the design is subjected to testability analysis.

The testability analysis involves two distinct aspects. The first is initialization. The second is the actual testability evaluation. During this step the testability analyzer calculates the controllability and observability values which are then compounded to determine the final coverage number. The integrated circuit must be capable of being initialized before it is tested, and for this purpose generally includes an input terminal for receiving Master Clear signals. The Master Clear signal comes into the chip through a regular signal pin. In the built-in self-test circuit environment the Master Clear pin, as all the other signal pins, is by definition connected to one bit of the test register. A circuit is initialized when all of its memory-type macros (e.g. non-combinational macros) such as flip flops, RAM's, counters, etc. are in a known state. Generally, this imposes the following conditions on the designer:

1. For memory-type macros which have a Clear or Set input, that input must be made active or set to a first or logic one state, if it is a true input, or a second or logic zero state, if it is an inverted input, during the initialization sequence;

2. For memory-type macros which do not have a Clear or Set input, but have an Enable input, the Enable input has to be active or set to a first or logic one state, if it is a true input, or a second or logic zero state, if it is an inverted input, to enable the passage of initialization data; and 3. For memory-type or multiplexer-type macros which do not have any of the above inputs, but have a Select input, it must be verified that no feedback paths are selected during initialization.

To be thoroughly testable the integrated circuit must be both controllable and observable. A circuit is controllable if the inputs and outputs of its component logic macros can be changed by signals applied to the input pins of the circuit. A circuit is observable if changes to the inputs and outputs of its component logic macros generate corresponding changes at the circuit output pins. If the integrated circuit is to be controllable and observable during the test procedures, data must be capable of freely flowing through the circuit. The following conditions must therefore be met during the test:

1. Enable inputs of logic macros must be active;

2. Clear inputs must be disabled to permit the propagation of simulation data through the circuit;

3. Select inputs must be at logic zero and logic one states equal amounts of time to select all the input data presented to the inputs of multiplexers; and 4. All macro outputs must be connected forward.

Figure 1:
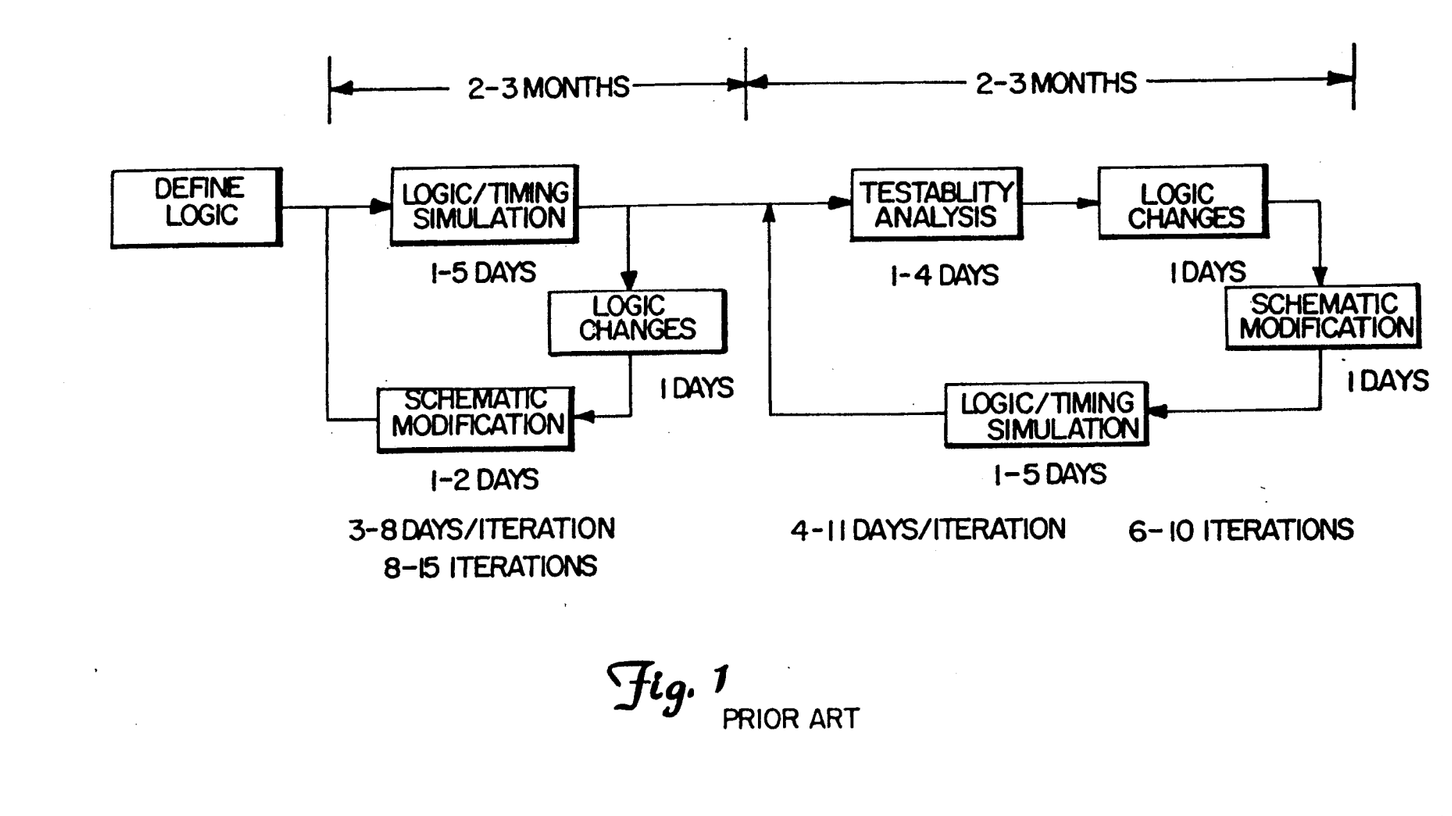
FIG. 1 is a block diagram representation of prior art procedures used to perform logic and timing simulations and testability analysis on integrated circuit designs.

As illustrated in FIG. 1, the testability analysis is usually performed following the definition and simulation of the integrated circuit logic. The testability analysis itself often requires one to four days. Logic changes and associated schematic modifications (redefinitions) necesSitated by the testability analysis can each take another day to perform. Logic and timing simulations for the modified overall circuit, often requiring from one to five days of the designer's time, must then be repeated. Each iteration of the testability analysis requires four to eleven days. It is not uncommon to repeat this sequence of operations six to ten times before the testability analysis and associated design changes are completed. Four to six months are therefore required to complete both the logic simulation and testability analysis for a VLSI circuit.

The classic design approach described above has other drawbacks. Chip level initialization is often solved by adding on the normal Master Clear line a circuit which produces an n-clock long pulse at the start of the test sequence. The value of n is determined by the particular design requirements. This circuit has to be switched off after the desired number of clocks, and must be more or less custom-made for each design. Testability analysis problems are sometimes overcome by adding special circuits to the flip flop inputs to (mostly) enable their normal operation during test. Both of these solutions are done on an ad hoc basis, and require valuable space on the integrated circuit.

It is evident that there is a continuing need for improved circuit design techniques. A methodology and circuit which reduce the time required for the testability analysis and the functional simulation generated by the testability changes is needed. The improved procedures should be capable of implementation on a CAD work station. Circuitry added to the chip to facilitate these objectives should occupy as little space as necessary.

SUMMARY OF THE INVENTION

The present invention is an improved method for designing electronic systems. A main logic function operable in initialization and test modes is defined in terms of component logic elements. Testability circuitry for generating CLEAR, CLEAR0 and CLEAR1 testability signals is defined. The CLEAR signals have a first logic state during system operation in the initialization mode and have the first and second logic states approximately equal amounts of time during system operation in the test mode. The CLEAR0 signals have the first logic state during system operation in the initialization mode and have the second logic state most of the time and the first logic state the remainder of the time during system operation in the test mode. The CLEAR1 signals have the first logic state during system operation in the initialization mode and have the first logic state most of the time and the second logic state the remainder of the time during system operation in the test mode. Logic elements of the main logic function to which CLEAR, CLEAR0 and CLEAR1 testability signals can be provided to facilitate system operation in the initialization and test modes are identified. Interconnections of the CLEAR, CLEAR0 and CLEAR1 testability signals to the associated identified logic elements are defined. Logic and timing simulations and testability analysis are then performed on the system before any redefinition of the main logic function.

In other embodiments the main logic function is redefined by making changes as a function of the results of the logic and timing simulations and testability analysis. Logic and timing simulations and testability analysis on the redefined system are then performed prior to any subsequent redefinition of the main logic function. These steps are repeated until the system design is complete.

In other embodiments the identification of circuit elements includes identifying first, second and third-type logic elements. The first-type logic elements have Select or other inputs requiring first and second logic state signals for system operation during the test mode. The second-type logic elements have CLEAR, SET or other inputs requiring second logic state signals for system operation during the test mode. The third-type logic elements have Enable or other inputs requiring first logic state signals for system operation during the test mode. Defining interconnections includes defining interconnections of the CLEAR signals to the first-type logic elements, interconnections of the CLEAR0 signals to the second-type logic elements, and interconnections of the CLEAR1 signals to the third-type logic elements.

DETAILED DESCRIPTION OF THE PREFERRED EMBODIMENTS

Figure 2:
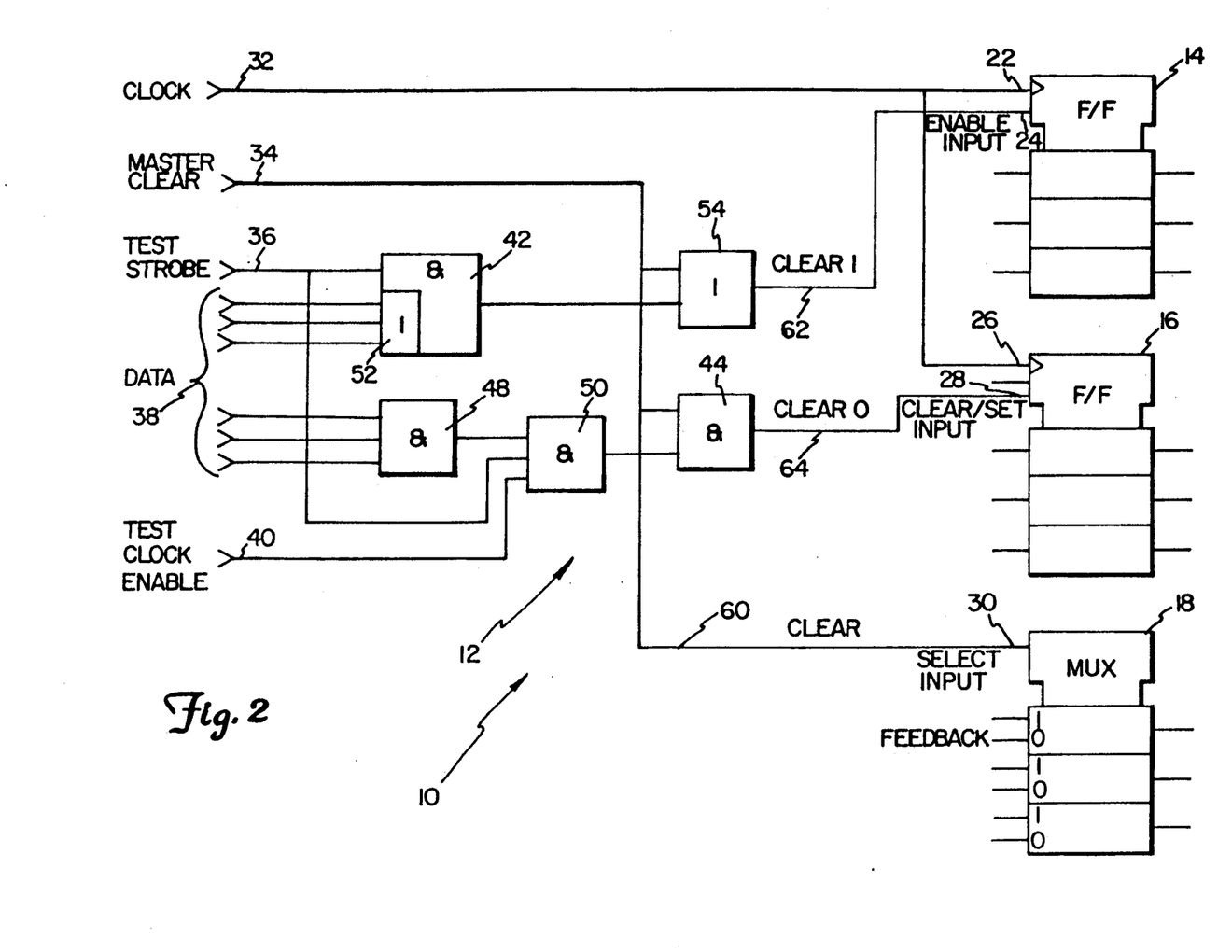
FIG. 2 is a schematic illustration of a first integrated circuit designed in accordance with the present invention.

A VLSI integrated circuit chip 10 which includes testability circuitry 12 designed in accordance with the present invention is illustrated generally in FIG. 2. A large number of logic macros including flip flop (F/F) stacks 14 and 16 and multiplexer (MUX) stack 18 are fabricated on integrated circuit chip 10. Each flip flop of stack 14 includes a Clock input terminal 22 and an Enable input terminal 24. The flip flops of stack 16 include a Clock input terminal 26 and a Clear input terminal 28. The multiplexers of stack 18 include a Select terminal 30. Although only flip flops and multiplexers are illustrated, integrated circuit 10 can also include a large number of other commonly used memory-type, non-combinational or combinational logic macros.

Integrated circuit chip 10 is adapted to receive a number of standard input signals. These include a Clock signal which is applied to terminal 32, a Master Clear signal applied to terminal 34, a Test Strobe signal applied to terminal 36, Data signals applied to terminals 38, and a Test Clock Enable signal applied to terminal 40. The Clock signal is used to synchronize the action of logic macros such as flip flop stacks 14 and 16. The Master Clear signal is used to initialize integrated circuit 10, or to set logic macros such as 14, 16 and 18 in a known state prior to testing and other circuit operations. The Master Clear signal switches between a first or logic one state and a second or zero logic state in a pseudo random or random manner (i.e. has each state approximately half the time) while circuit 10 is operated in its test mode. The Master Clear signal should be set to a logic one during initialization. However, an additional or other circuitry (not shown) can be provided for the purpose of obtaining the same initialization effect. The Test Strobe signals control the operating mode of integrated circuit 10. Integrated circuit 10 operates in the test mode when Test Strobe is a logic one, and operates in its normal operating mode when Test Strobe is logic zero. Test Clock Enable signals control the flow of test data through integrated circuit 10 (e.g. enables the clocking of registers of built-in self-test or other test circuitry (not shown)). Test Clock Enable will be in a logic zero state when integrated circuit 10 is being initialized, and switches between logic one and zero states during test operations. During test procedures randomly changing Data signals having the first logic state forty to sixty percent of the time and the second logic state the remainder of the time are typically applied to terminals 38.

Testability circuitry 12 includes AND gates 42 and 44, NAND gates 48 and 50, and OR gates 52 and 54. In response to the input signal applied to integrated circuit 10 through terminals 34–40, testability circuitry 12 generates three different testability signals designated CLEAR0, CLEAR1, and CLEAR.

CLEAR0 is a signal which is active (has a logic one state) during an initialization mode, but is inactive (has a logic zero state) most of the time that integrated circuit 10 is operated in a test mode. The CLEAR0 signal is inactive eighty to ninety-nine (and preferably ninety-four) percent of the time during circuit operation in the test mode. The CLEAR0 signal is produced by testability circuitry 12 at output terminal 64 of AND gate 44 in the embodiment shown. This signal is coupled to control terminals of second-type logic macros, such as Clear input terminal 28 of flip flop stack 16, which must be inactive during the operation of circuit 10 in the test mode.

CLEAR1 is a signal which is active (logic one) during the operation of circuit 10 in the initialization mode and mostly active during circuit operation in the test mode. CLEAR1 is active for eighty to ninety-nine (and preferably ninety-four) percent of the time that circuit 10 is operated in its test mode. In the embodiment shown, CLEAR1 is produced by testability circuit 12 at output terminal 62 of OR gate 54. This signal is coupled to control input terminals of third-type logic macros, such as the Enable input terminal 24 of flip flop stack 14, which must be active to properly test integrated circuit 10 when it is operated in the test mode.

CLEAR is a signal which is active during circuit operation in the initialization mode, but is at its logic zero and logic one states for approximately equal amounts of time during the test mode. Testability circuitry 12 utilizes the Master Clear signal for this purpose in the embodiment illustrated in FIG. 2. In one embodiment the CLEAR signal has a logic one state forty to sixty (and preferably fifty) percent of the time during operation in the test mode, and a logic zero state for the remainder of the time. The CLEAR signal is applied to control inputs of multiplexer-type or other first-type logic macros which must have both active and inactive signals during circuit operation in the test mode. In the embodiment shown the CLEAR signal is applied to Select terminal 30 of multiplexer 18 so that all inputs will be selected equally during test, and the Select 1 input will be chosen during initialization in order to avoid feedback. In some embodiments (not shown) the first-type logic macros do not require active signals for proper operation in the initialization mode. For these embodiments the signal applied to the Select line does not have to be active during circuit operation in the initialization mode.

Following its fabrication, integrated circuit 10 is operated in the initialization mode. After initialization integrated circuit 10 is operated in its test mode during which the CLEAR, CLEAR0 and CLEAR1 signals are applied to the appropriate macros such as 14, 16 and 18 in the manner descried above. Simultaneously, test data or operands generated by either external or on-chip circuitry (not shown) are clocked through integrated circuit 10 in a known manner. Data outputted from integrated circuit 10 is then analyzed to determine whether the circuit is functioning properly.

Figure 4:
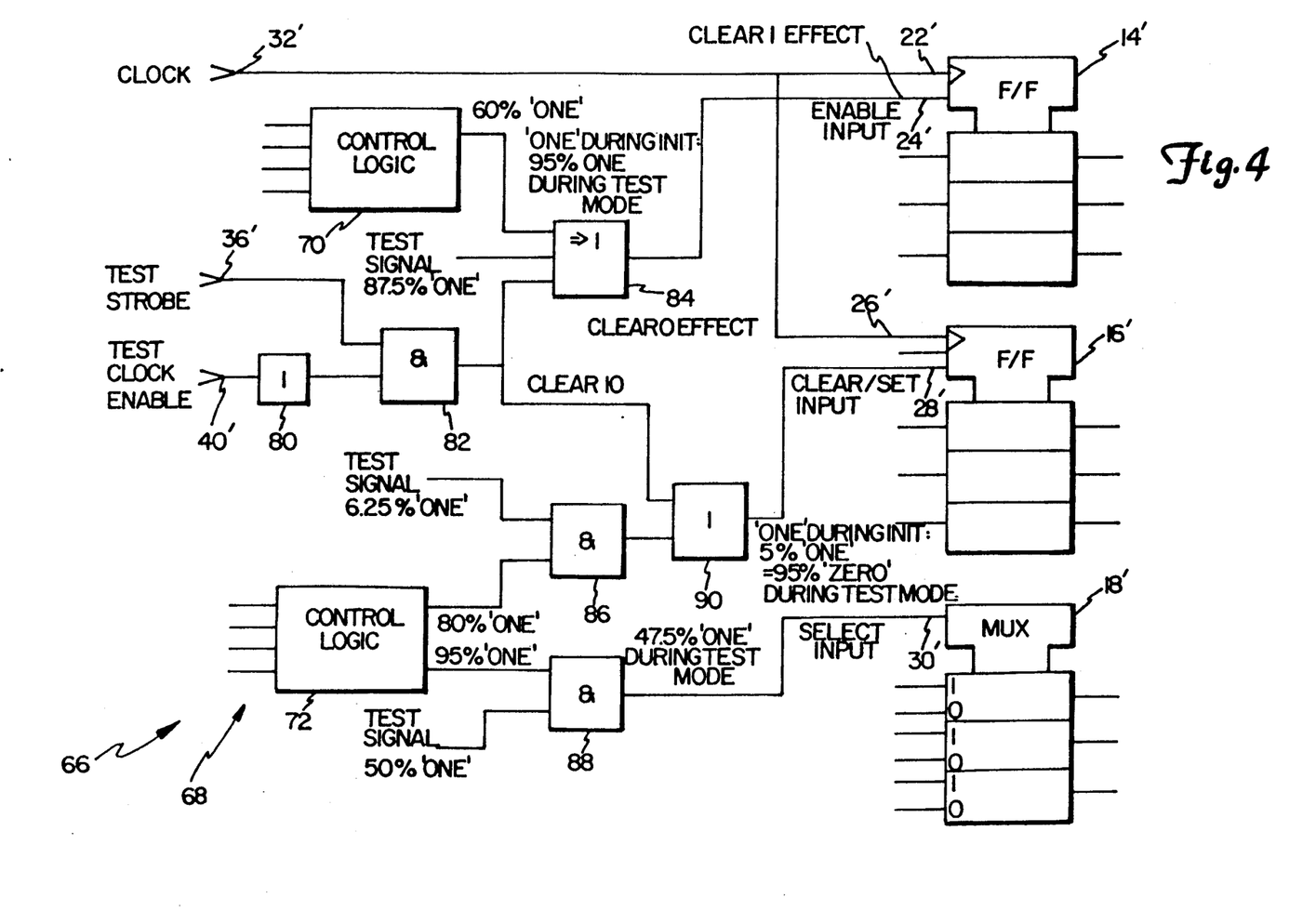
FIG. 4 is a schematic illustration of a second integrated circuit designed in accordance with the present invention.

Another embodiment of the invention, integrated circuit chip 66 with its testability circuitry 68, is illustrated in FIG. 4. Chip 66 includes flip flop stacks 14' and 16' and multiplexer stack 18' which can be identical to corresponding stacks of chip 10 described above. Flip flop stacks 14' and 16' have respective Clock input terminals 22' and 26' connected to receive a Clock signal applied to terminal 32'. Chip 66 also receives Test Strobe signals at terminal 36' and Test Clocks Enable signals at terminal 40'.

As shown in FIG. 4, chip 66 also includes control logic circuitry 70 and 72. Control logic 70 generates signals which are coupled to Enable input terminal 24' of flip flop stack 14'. Control logic 72 produces signals which are applied to Clear input terminal 28' of flip flop stack 16' and Select terminal 30' of multiplexer stack 18'. The signals generated by testability circuitry 12 must therefore be logically combined with the signals produced by logic 70 and 72 in a manner consistent with the characteristics of the CLEAR1, CLEAR0 and CLEAR signals as described above. The net effect of testability circuitry 68 must be to produce signals having the characteristics of CLEAR1, CLEAR0 and CLEAR at the associated terminals 24', 28' and 30' during the operation of chip 66 in the initialization and test modes.

In the embodiment shown in FIG. 4, the signal produced by control logic 70 and coupled to Enable terminal 24' of flip flop stack 14' has a logic one state sixty percent of the time while chip 66 is operated in its test mode. NOR gate 80, AND gate 82 and OR gate 84, portions of testability circuitry 68, are added to chip 66 to produce a signal having CLEAR1 characteristics (i.e., a CLEAR1 effect). A CLEAR10 signal having a logic one state during operation in the initialization mode and a logic zero state during operation in the test mode is produced at the output of AND gate 82. The CLEAR1 signal is generated at the output of gate 84 by logic ORing the CLEAR10 signal, the signal produced by control logic 70, and a test signal having a logic one state 87 ½ percent of the time during circuit operation in the test mode. The 87 ½ percent logic one test signal applied to OR gate 84 can be produced by other portions (not shown) of testability circuitry 68 such as a three input OR gate having its inputs coupled to receive randomly changing data signals. The CLEAR1 signal generated by testability circuitry 68 will have a logic one state during circuit operation in the initialization mode, a logic one state for 95 percent of the time during circuit operation in the test mode, and a logic zero state for remaining time periods during circuit operation in the test mode.

The signal produced by control logic 72 and coupled to Clear input terminal 28' of flip flop stack 16' has a logic one state 80 percent of the time while chip 66 is operated in its test mode. AND gate 86 and OR gate 90 of testability circuitry 68 are added to chip 66 to produce a signal having CLEAR0 characteristics (i.e., a CLEAR0 effect). As shown, a test signal having a logic one state 6 ¼ percent of the time during circuit operation in the test mode is ANDed with the 80 percent logic one signal produced by control logic 72 at gate 86. The output of AND gate 86 is applied to OR gate 90 along with the CLEAR10 signal. A CLEAR0 signal is generated at the output of OR gate 90 and applied to Clear input terminal 28' of flip flop stack 16'. The CLEAR0 signal has a logic one state during circuit operation in the initialization mode, a logic one state 5 percent of the time during circuit operation in the test mode, and a logic zero state during the remaining time periods of circuit operation in the test mode. The 6 ¼ percent logic one test signal applied to AND gate 86 can be produced by other portions of testability circuitry 68 (not shown) such as a four-input AND gate having its inputs coupled to receive randomly changing data signals.

The signal produced by control logic 72 and coupled to the select input terminal 30' of multiplexer stack 18' has a logic one state 95 percent of the time while chip 66 is operated in its test mode. AND gate 88 of testability circuitry 68 is added to chip 66 to produce a signal having CLEAR characteristics during test mode (i.e., a CLEAR effect). The signal is generated at the output of gate 88 by logic ANDing the 95 percent one signal produced by control logic 72 with a test signal having a logic one state 50 percent of the time during circuit operation in the test mode. The 50 percent logic one test signal applied to AND gate 88 can be produced by other portions of testability circuitry 68 (not shown) or could be a Master Clear signal applied to chip 66. The test signal generated by testability circuitry 88 will have a logic one state 47 ½ percent of the time during circuit operation in the test mode, and a logic zero state during the remaining time portions. Select input terminal 30' of multiplexer 18' does not have to be at a logic one state during operation in the initialization mode.

Figure 3:
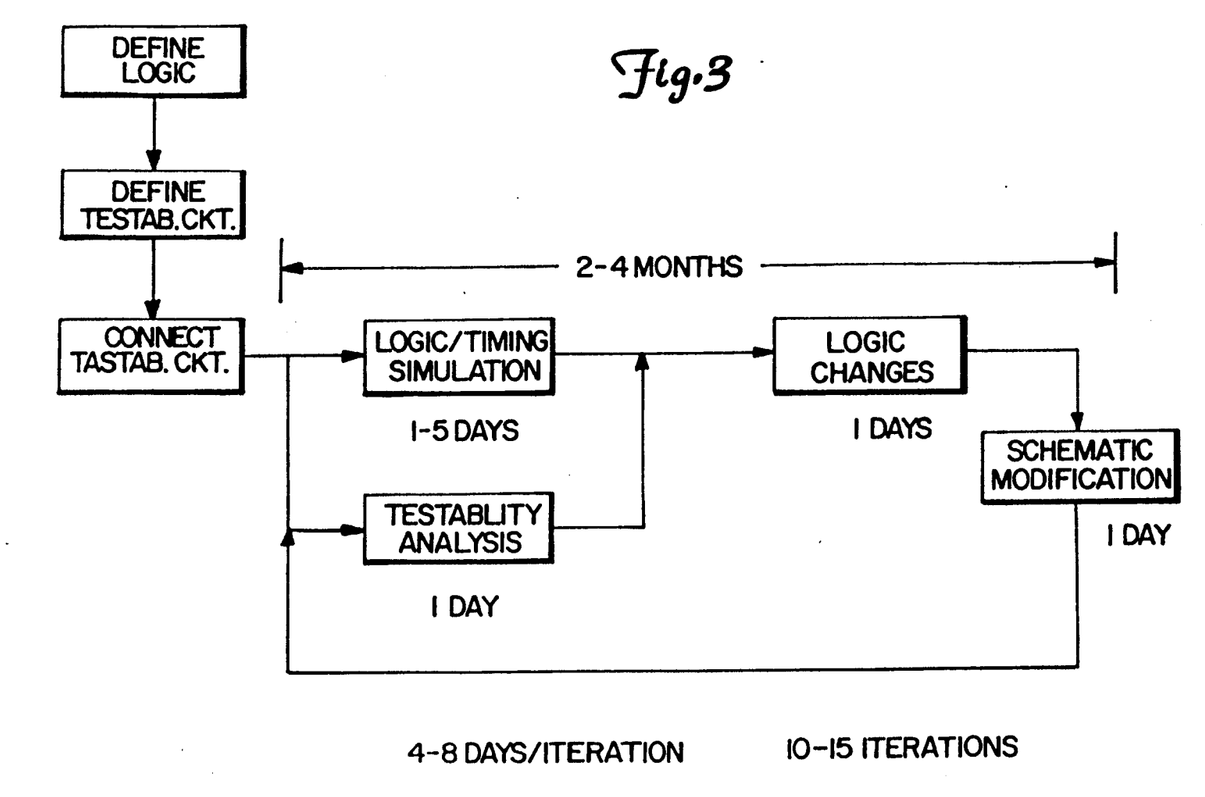
FIG. 3 is a block diagram representation of the method for designing integrated circuits in accordance with the present invention.

Testability circuitry such as 12 and 68 which generates CLEAR1, CLEAR0 and CLEAR signals of the types described above can also be used in conjunction with a new methodology which facilitates the design of VLSI circuit chips. This design approach is illustrated in FIG. 3. Software characterizing testability circuitry 12 is stored within a CAD work station and is used by the designer along with other tools during the design process.

The main logic function is first defined in a standard manner. Testability circuitry in accordance with the present invention capable of generating the CLEAR1, CLEAR0, and CLEAR signals is defined and stored in the work station. All first, second and third-type logic macros as well as the associated testability control signal which will be required for proper circuit operation in the test mode are also identified. Interconnections between the various logic macros and their associated testability control signals is then defined.

Once the integrated circuit chip has been defined at the work station in this manner, logic and timing simulation as well as testability analysis can be performed simultaneously or during overlapping time periods as shown in FIG. 3 (i.e. both are done before logic changes and schematic modifications are made). Most importantly, the results of the logic and timing simulation and testability analysis can be used concurrently when making logic changes to the integrated circuit. Logic changes and schematic modifications need only be made once for each iteration of logic and timing simulation and testability analysis. The testability cycle can therefore be reduced to four to eight days per iteration. Experience has shown that ten to fifteen iterations are generally required. As a result, only two to four months are required to complete logic and timing simulation and testability analysis using the methodology and circuit of the present invention.

The integrated circuit and methodology of the present invention offer considerable advantages over known techniques. The testability circuitry greatly facilitates the initialization and testing of the integrated circuit, yet requires fewer logic gates and less space than the classic approach. By approaching testability analysis from circuit topology rather than from logic simulation results the designer can move testability analysis considerations to the beginning of the design cycle. Design time and therefore overall circuit costs can be greatly reduced. The circuitry and methodology work well with all testability approaches including scan design and built-in self-test as long as the characteristics of the input signals to the circuitry are as described above. Furthermore, in addition to use with integrated circuits as described above (e.g. VLSI, MSI and LSI circuits), this circuitry and methodology can be used in circuit board and system level applications.

Although the present invention has been described with reference to preferred embodiments, those skilled in the art will recognize that changes may be made in form and detail without departing from the spirit and scope of the invention. By way of example, other circuit configurations can be implemented to generate CLEAR, CLEAR0 and CLEAR1 signals having the characteristics described above.

What is claimed is:

1. A method for designing an electronic system, including:
    defining a main logic function operable in initialization and test modes in terms of component logic elements;
    defining testability circuitry for generating testability signals including:
        CLEAR signals having a first logic state during system operation in the initialization mode and having first and second logic states approximately equal amounts of time during system operation in the test mode;
        CLEAR0 signals having the first logic state during system operation in the initialization mode and having the second logic state most of the time and the first logic state the remainder of the time during system operation in the test mode; and
        CLEAR1 signals having the first logic state during system operation in the initialization mode and having the first logic state most of the time and the second logic state the remainder of the time during system operation in the test mode;
    identifying logic elements of the main logic function to which CLEAR, CLEAR0 or CLEAR1 testability signals can be provided to facilitate system operation in the initialization and test modes;
    defining interconnections of the associated CLEAR, CLEAR0 or CLEAR1 testability signals to the identified logic elements; and
    performing logic and timing simulations and testability analysis on the system before redefining the main logic function.

2. The method of claim 1 and further including:
    redefining the main logic function by making changes as a function of the results of the logic and timing simulations and testability analysis; and performing logic and timing simulations and testability analysis on the redefined system prior to any subsequent redefinition of the main logic function.

3. The method of claim 2 and further including repeating the steps of claim 2 until system design is complete.

4. The method of claim 1 wherein defining testability circuitry includes defining testability circuitry for generating testability signals including:
CLEAR signals having the first logic state during system operation in the initialization mode and having forty to sixty percent of the time and the second logic state the remainder of the time during system operation in the test mode;
CLEAR0 signals having the first logic state during system operation in the initialization mode and having the second logic state at least eighty percent of the time and the first logic state the remainder of the time during system operation in the Test mode; and
CLEAR1 signals having the first logic state during system operation in the initialization mode and having the first logic state at least eighty percent of the time and the second logic state the remainder of the time during system operation in the test mode.

5. The method of claim 1 wherein defining testability circuitry includes defining testability circuitry responsive to initialization/test control signals including:
Master Clear signals having the first logic state during system operation in the initialization mode and switching between logic one and logic zero states in a generally random manner during operation in the test mode;
Test Strobe signals for enabling system operation in the test mode;
Test Data signals; and
Test Clock Enable signals for enabling clocking of the Test Data through the main logic function.

6. The method of claim 5 wherein defining testability circuitry includes:
defining circuit means for providing the CLEAR signals as a copy of the Master Clear signals;
defining first OR gate means for providing output signals as a logical OR function of the Test Data signals;
defining first AND gate means for providing output signals as a logical AND function of the first OR gate means output signals and the Test Strobe signals;
defining second OR gate means for providing the CLEAR1 signals as a logical OR function of the Master Clear signals and the first AND gate means output signals;
defining first NAND gate means for providing output signals as a logical NAND function of the Test Data signals;
defining second NAND gate means for providing output signals as a logical NAND function of the first NAND gate means output signals, the Test Strobe signals, and the Test Clock Enable signals; and
defining second AND gate means for providing the CLEAR0 signals as a logical AND function of the Master Clear signals and the second NAND gate means output signals.

7. The method of claim 1 wherein:
identifying logic elements includes:
identifying first-type logic elements having SELECT or other inputs requiring first and second logic state signals for system operation during the test mode;
identifying second-type logic elements having CLEAR, SET or other inputs requiring second logic state signals for system operation during the test mode; and
identifying third-type logic elements having Enable or other inputs requiring first logic state signals for system operation during the test mode; and
defining interconnections includes defining the interconnections of the CLEAR signals to the first-type logic elements, interconnections of the CLEAR0 signals to the second-type logic elements, and interconnections of the CLEAR1 signals to the third-type logic elements.

8. The method of claim 7 wherein:
defining the main logic function includes defining control logic for producing output signals coupled to the inputs of the first-type, second-type and/or third-type logic elements and for controlling the logic elements; and
defining testability circuitry includes defining testability circuitry for producing the CLEAR, CLEAR0 and CLEAR1 signals as a logical function of the output signals of the control logic.

9. A method for designing integrated circuits, including:
defining a main logic function operable in initialization and test modes in terms of component circuit elements and a net list;
defining testability circuitry for generating testability signals including:
CLEAR signals having a first logic state during circuit operation in the initialization mode and having first and second logic states approximately equal amounts of time during circuit operation in the test mode;
CLEAR0 signals having the first logic state during circuit operation in the initialization mode and having the second logic state most of the time and the first logic state the remainder of the time during circuit operation in the test mode; and
CLEAR1 signals having the first logic state during circuit operation in the initialization mode and having the first logic state most of the time and the second logic state the remainder of the time during circuit operation in the test mode;
identifying circuit elements of the main logic function to which CLEAR, CLEAR0 or CLEAR1 testability signals can be provided to facilitate circuit operation in the initialization and test modes;
defining interconnections between the identified circuit elments and associated CLEAR, CLEAR0 and CLEAR1 testability signals; and
performing logic and timing simulations and testability analysis of the integrated circuit before redefining the main logic function.

10. The method of claim 9 and further including:
redefining the main logic function by making changes as a function of the results of the logic and timing simulations and testability analysis; and
performing logic and timing simulations and testability analysis on the redefined integrated circuit prior to any subsequent redefinition of the main logic function.

11. The method of claim 10 and further including repeating the steps of claim 10 until the integrated circuit design is complete.

12. The method of claim 9 wherein defining testability circuitry includes defining testability circuitry for generating initialization and test signals including:

CLEAR signals having the first logic state during circuit operation in the initialization mode and having the first logic state forty to sixty percent of the time and a second logic state the remainder of the time during circuit operation in the test mode;

CLEAR0 signals having the first logic state during circuit operation in the initialization mode and having the second logic state at least eighty percent of the time and the first logic state the remainder of the time during circuit operation in the test mode; and CLEAR1 signals having the first logic state during circuit operation in the initialization mode and having the first logic state at least eighty percent of the time and the second logic state the remainder of the time during circuit operation in the test mode.

13. The method of claim 9 wherein defining testability circuitry includes defining testability circuitry responsive to initialization/test control signals including:

Master Clear signals having the first logic state during system operation in the initialization mode and switching between logic one and logic zero states in a generally random manner during operation in the test mode;

Test Strobe signals for enabling operation of the integrated circuit in the test mode;

Test Data signals; and

Test Clock Enable signals for enabling clocking of the Test Data through the main logic function.

14. The method of claim 13 wherein defining testability circuitry includes:

defining circuit means for providing the CLEAR signals as a copy of the Master Clear signals;

defining first OR gate means for providing output signals as a logical OR function of the Test Data signals;

defining first AND gate means for providing output signals as a logical AND function of the first OR gate means output signals and the Test Strobe signals;

defining second OR gate means for providing the CLEAR1 signals as a logical OR function of the Master Clear signals and the first AND gate means output signals;

defining first NAND gate means for providing output signals as a logical NAND function of the Test Data signals;

defining second NAND gate means for providing output signals as a logical NAND function of the first NAND gate means output signals, the Test Strobe signals, and the Test Clock Enable signals; and defining second AND gate means for providing the CLEAR0 signals as a logical AND function of the Master Clear signals and the second NAND gate means output signals.

15. The method of claim 9 wherein:

identifying circuit elements includes:

identifying first-type circuit elements having Select or other inputs requiring first and second logic state signals for circuit operation during the test mode;

identifying second-type circuit elements having Clear, Set or other inputs requiring second logic state signals for circuit operation during the test mode; and identifying third-type circuit elements having Enable or other inputs requiring first logic state signals for circuit operation during the test mode; and defining interconnections includes defining interconnections of the CLEAR signals to the first-type circuit elements, interconnections of the CLEAR0 signals to the second-type circuit elements, and interconnections of the CLEAR1 signals to the third-type circuit elements.

16. The method of claim 15 wherein:

defining the main logic function includes defining control logic for producing output signals coupled to the inputs of the first-type, second-type and/or third-type logic elements and for controlling the logic elements; and defining testability circuitry includes defining testability circuitry for producing the CLEAR, CLEAR0 and CLEAR1 signals as a logical function of the output signals of the control logic.

17. An integrated circuit operable in initialization and test modes, including:

testability circuitry means for generating testability signals including:

CLEAR signals having a first logic state during circuit operation in the initialization mode and having the first and second logic state approximately equal amounts of time during circuit operation in the test mode;

CLEAR0 signals having the first logic state during circuit operation in the initialization mode and having the second logic state most of the time and the first logic state the remainder of the time during circuit operation in the test mode; and CLEAR1 signals having the first logic state during circuit operation in the initialization mode and having the first logic state most of the time and the second logic state the remainder of the time during circuit operation in the test mode; and a main logic function formed by circuit elements including:

first-type circuit elements having Select or other inputs coupled to receive the CLEAR signals;

second-type circuit elements having CLEAR, SET or other inputs connected to receive the CLEAR0 signals; and third-type circuit elements having Enable or other inputs coupled to receive the CLEAR1 signals.

18. The integrated circuit of claim 17 wherein the testability circuitry means includes:

Master Clear means for receiving Master Clear signals having the first logic state during system operation in the initialization mode and switching between logic one and logic zero states in a generally random manner during operation in the test mode;

Test Strobe means for receiving Test Strobe signals for enabling operation of the integrated circuit in the test mode;

Test Data means for receiving Test Data signals; and

Test Clock Enable means for receiving Test Clock Enable signals for enabling clocking of the Test Data through the main logic function.

19. The integrated circuit of claim 18 wherein the testability circuitry means includes:

circuit means coupled to the master clear means for providing the CLEAR signals as a copy of the Master Clear signals;

first OR gate means coupled to the test data means for providing output signals as a logical OR function of the Test Data signals;

first AND gate means coupled to the first OR gate means and the test strobe means for providing output signals as a logical AND function of the first OR gate means output signals and the Test Strobe signals;

second OR gate means coupled to the first AND gate means and the master clear means for providing the CLEAR1 signals as a logical OR function of the Master Clear signals and the first AND gate means output signals;

first NAND gate means coupled to the test data means for providing output signals as a logical NAND function of the Test Data signals;

second NAND gate means coupled to the first NAND gate means, the test strobe means, and the test clock enable means for providing output signals as a logical NAND function of the first NAND gate means output signals, the Test Strobe signals, and the Test Clock Enable signals; and second AND gate means coupled to the master clear means and the second NAND gate means for providing the CLEAR0 signals as a logical AND function of the Master Clear signals and the second NAND gate output signals.

20. The integrated circuit of claim 17 wherein:

the main logic function further includes control logic for producing output signals coupled to inputs of the first-type, second-type and/or third-type circuit elements and for controlling the circuit elements; and the testability circuitry means further includes circuitry for producing the CLEAR, CLEAR0 and/or CLEAR1 testability signals as a logical function of the output signals of the control logic.

* * * * *